United States Patent [19]

Klingshirn et al.

[11] Patent Number: 5,242,531
[45] Date of Patent: Sep. 7, 1993

[54] CONTINUOUS LIQUID SILICON RECHARGING PROCESS IN CZOCHRALSKI CRUCIBLE PULLING

[75] Inventors: Herbert Klingshirn; Reinhard Lang, both of Burghausen, Fed. Rep. of Germany

[73] Assignee: Wacker-Chemitronic Gesellschaft fur Elektronik-Grundstoffe m.b.H., Burghausen, Fed. Rep. of Germany

[21] Appl. No.: 829,402

[22] Filed: Feb. 3, 1992

[30] Foreign Application Priority Data

Mar. 1, 1991 [DE] Fed. Rep. of Germany ....... 4106589

[51] Int. Cl.$^5$ ............................................. C30B 29/06
[52] U.S. Cl. .................................. 156/620.4; 156/600; 156/617.1; 156/618.1; 156/620.3; 156/DIG. 83; 156/DIG. 115; 422/248; 422/249; 422/253
[58] Field of Search .................. 156/600, 617.1, 618.1, 156/620.3, 620.4, DIG. 83, DIG. 115; 422/248, 249, 253

[56] References Cited

U.S. PATENT DOCUMENTS

| | | | |
|---|---|---|---|
| 4,036,595 | 7/1977 | Lorenzini et al. | 156/617.1 |
| 4,379,021 | 4/1983 | Damen et al. | 156/DIG. 115 |
| 4,410,494 | 10/1983 | Fiegl | 422/106 |
| 4,547,258 | 10/1985 | Witter et al. | 156/620.4 |
| 4,659,421 | 4/1987 | Jewett | 156/617.1 |
| 5,037,503 | 8/1991 | Kajimoto et al. | 156/620.4 |

FOREIGN PATENT DOCUMENTS 0170856A 6/1985 European Pat. Off. .
245510 10/1986 European Pat. Off. .

OTHER PUBLICATIONS

Fiegl, "Recent Advances and Future Directions in CZ-Silicon Crystal Growth Technology," *Solid State Technology*, Aug. 1983, pp. 121-131.

Zulehner and Huber, "Czochralski-Grown Silicon," *Crystals* 8, Springer Verlag, Berlin-Heidelberg, 1982.

*Primary Examiner*—Robert Kunemund
*Assistant Examiner*—Felisa Garrett
*Attorney, Agent, or Firm*—Collard & Roe

[57] ABSTRACT

In the Czochralski crucible pulling of crystal ingots, in particular those of silicon and having particularly large crystal diameters, the degree of filling of the crucible is kept approximately constant during the pulling process by continuously adding solid or liquid recharging material. According to the invention, the known disadvantages of thermal disturbances and the introduction of impurities and particles are overcome by a recharging system with a gas-tight seal, comprising additional crucible, stock container for semiconductor material and dopant having the appropriate feedlines and an exhaust gas line. In addition, the process makes possible a regulatable and separate recharging of dopant via the additional crucible.

4 Claims, 1 Drawing Sheet

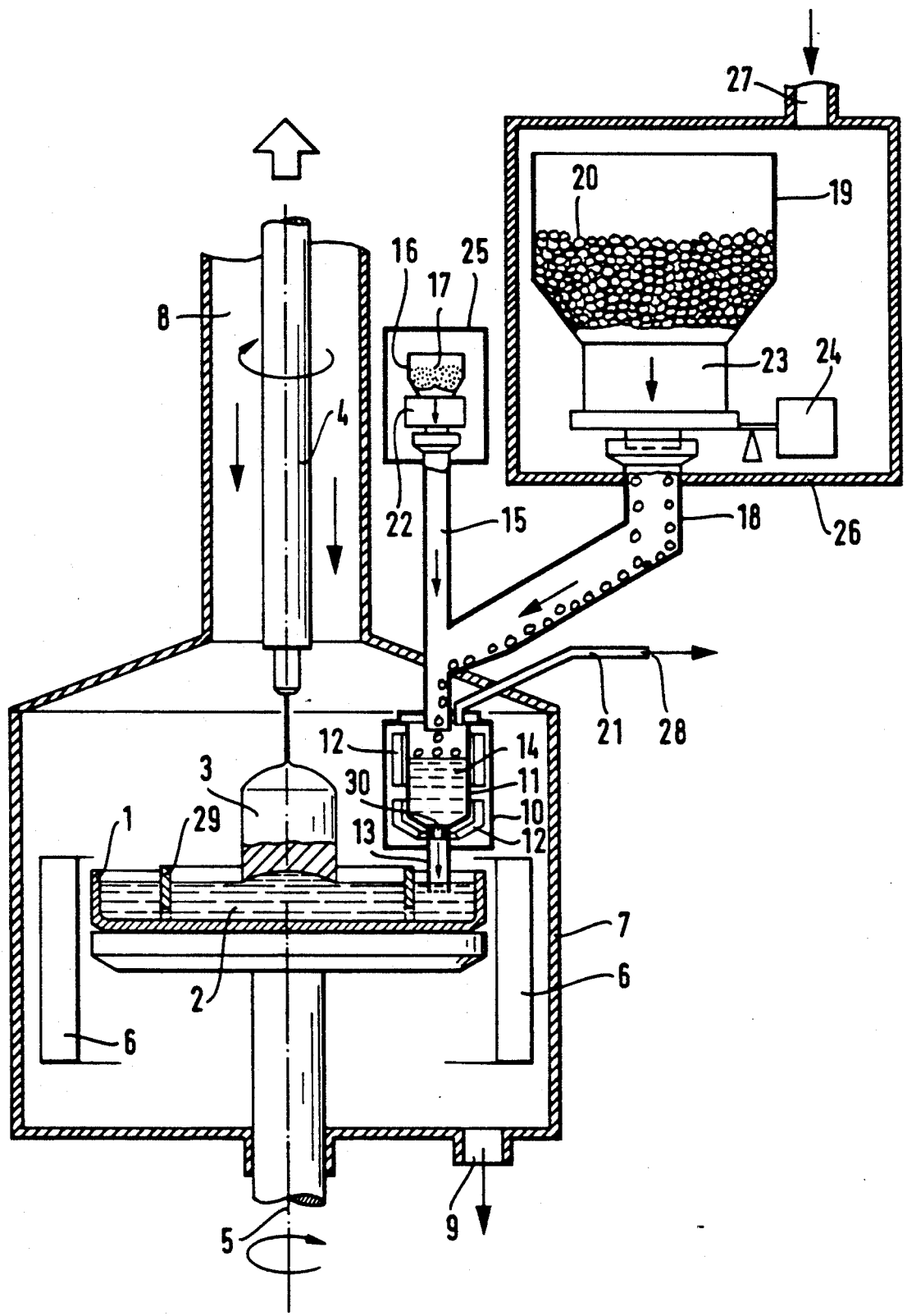

CONTINUOUS LIQUID SILICON RECHARGING PROCESS IN CZOCHRALSKI CRUCIBLE PULLING

BACKGROUND OF THE INVENTION

1. Field of the Invention

The present invention relates to an apparatus for producing high-purity, single-crystal semiconductor ingots, in particular of silicon, from a melt under protective gas. It furthermore relates to a process for the crucible pulling of high-purity, single-crystal silicon ingots using this apparatus.

2. The Prior Art

In the Czochralski crucible pulling of crystal ingots, in particular semiconductor ingots, the material provided for producing the melt is usually introduced into the melting crucible in lump form. The crucible temperature is then increased by heating until the melting point is reached and the crucible contents are gradually converted to the molten state. A seed crystal with the planned crystal orientation is then applied to the melt and is drawn out of the melt, in general while rotating crucible and crystal. The crucible pulling process is explained in detail, for example, in W. Zulehner and D. Huber, Czochralski-Grown Silicon, Crystals 8, Springer Verlag, Berlin-Heidelberg, 1982, and in the literature cited therein with particular attention being paid to the currently most important filed of application, namely, the crucible pulling of silicon single crystals.

To produce the melt, the melting crucible, which is composed, as a rule, of material which is substantially inert towards the melt, such as, for instance, quartz in the case of silicon or gallium arsenide, or iridium in the case of gallium gadolinium garnet, is first filled as substantially as possible with lumpy melt material. Then the temperature is raised to above the melting point, for example, by means of radiation or resistance heating, and the crucible contents are gradually caused to melt. Since, however, the lumpy material introduced does not permit a complete filling of the space in the melting crucible even with optimum adjustment of the particle limits, the amount of melt produced therefrom can, ultimately, only partly fill the crucible. In relation to the melt actually produced, therefore, over-dimensioned crucibles have to be provided, brought to the high working temperatures, and held there. This mismatch manifests itself all the more, the larger the ingots pulled, and, consequently, manifests itself in the amounts of melt required. For example, the common ingot diameters in the case of silicon are at present about 100 to 200 mm, with increases to about 300 mm even being under discussion. Added to this in the case of some materials such, as, in particular, silicon and germanium, is the appreciable volume contraction in some cases in the transition from the solid to the molten state.

In many cases, there has for this reason been a desire to improve the degree of filling of the crucible by adding further solid melting material to the melt, based upon lumpy material introduced after melting. For this purpose, polycrystalline ingot pieces are immersed as recharging material in the surface of the liquid melt by means of suitable holding devices as a rule before the start of the actual pulling process, and gradually melted until the desired melt level is reached.

In order to increase the amount of melting material introduced, and to operate the pulling process continuously instead of batchwise, a transition has been made to continuously replenishing melting material even during the crystallization process from a raw material container. Processes of this type are referred to as continuous Czochralski processes and are described, for instance, in G. Fiegl, Solid State Technology, August 1983, page 121. Two recharging possibilities are known in principle from the prior art and they differ in whether the melt material is added to the melt in the crucible as a liquid or as a solid. A continuous Czochralski pulling process with recharging of solid melt material is described in EP-A-0 170 856 and 0 245 510, and one with recharging of liquid melt material is described in U.S. Pat. No. 4,410,494.

One possibility of recharging a solid, which was described in EP-A-0 170 856, is to add solid granular material to the melt via an inlet tube. Since the melting process in this case first takes place in the melt from which the crystal is also pulled, the region in which the solid material is added to the melt is separated from the region of the crucible from which the single crystal is pulled, since disturbances in the single-crystal dislocation-free growth otherwise occur in the recharging as a result of thermal disturbances in the melt and of temperature variations. There has therefore, for example, been a desire to separate the crucible containing the melt material into an annular outer chamber in which the recharging material is melted and an inner chamber, in communication therewith, in which the crystal is pulled.

Another possibility of recharging solid melt material is described in the embodiment presented in EP-A-0 245 510. The melt material is recharged in this case by melting ingots of crystalline material to an increasing extent, while the same amount of material is simultaneously crystallized as a single crystal. In this process, the newly-formed melt first drips into a funnel-shaped crucible insert in order to avoid harmful convection flows which result in defects in the crystal growth.

However, this process has the disadvantage that suitable compact polycrystalline ingots can only be produced with difficulty in the required quality. In addition to the cost expenditure needed for this purpose, the disadvantage emerges that such ingots are particularly susceptible to chipping, particularly under the conditions prevailing in the pulling vessel, as a result of which unmelted chipped-off crystal parts fall into the actual melt during melting and disturb the crystallization process.

In both processes for recharging solid melt material, the risk associated with the introduction of solid material remains unchanged in that crystals which are not dislocation-free are pulled. If new polycrystalline material or granular material to be melted is introduced, this is, as a rule, associated with the introduction of very fine, mobile particles of semiconductor material. These particles are produced even during the introduction and melting of polycrystalline silicon blocks which do not, as a rule, melt at a constant rate, but shatter during melting. This fine material produced does not enter the interior of the melt (silicon melt is known to have a higher density than solid silicon). Instead, the finest dust particles float on the surface of the melt or are located in the gas space above the melt, and are incorporated into the single-crystal formed without having been previously melted, and this then results in growth defects.

Even a subdivision of the crucible cannot prevent these disadvantages.

These problems are all the more strongly manifested, the greater the proportion of recharged melt is compared with the melt originally contained in the main crucible. In particular, in shallow crucibles, which contain, after all, a correspondingly lesser amount of melt, and in the pulling of crystals with large diameter or large length, the risk of pulling imperfect crystals as a result of the large amount of recharged material is considerably increased.

A more complicated solution described in U.S. Pat. No. 4,410,494 is to provide two separate crucibles connected by a heated feedline so that the recharged material can be melted in a separate second crucible and recharged into the main crucible through the feedline.

This process has the disadvantage that the second vessel needed for melting causes increased investment and operating costs. Attempts are therefore made to connect a plurality of pulling vessels to one recharging vessel. This results in long feedlines between the vessels, which have to be permanently heated in order to prevent blockage. When the recharging vessel is shut down, for example, for maintenance or refilling work, all the pulling vessels have to be shut down. Conversely, if a pulling vessel is opened, for example, to insert a seed crystal, the recharging vessels also have to be shut down. If the feedlines are only temporarily provided for recharging, this results in contamination risks and the advantage of the continuous process, i.e. uninterrupted recharging facility, is lost.

A further disadvantage in all the processes hitherto known is the lack of accuracy in the metered addition of dopant. In general, it is desirable to establish constant dopant concentrations within narrow limits for the entire length of the ingot during the pulling process. This is made difficult by the fact that the dopant becomes either enriched or depleted in the melt during the crystallization because of differing segregation coefficients. Dopant also has therefore to be recharged, as a rule, during the pulling process. As a rule, the dopant is therefore added to the solid recharging material (that is to say, granular material or a polycrystalline ingot to be melted) or it is added to the melt material at the outset in an additional crucible. A change in the dopant concentration during the crystallization process is consequently made considerably more difficult, since the previous processes did not provide any facility for correcting the dopant concentration in the recharging material even during the pulling process without the system having to be opened.

SUMMARY OF THE INVENTION

It is an object of the present invention to provide an apparatus and a process which makes it possible to prevent the production of dust during the melting of the recharging material in a continuous Czochralski process, and simultaneously, to substantially remove during the melting process foreign particles and foreign gases which are produced during the melting without these foreign particles coming into contact with the region of the melt from which the dislocation-free single crystal is pulled. At the same time, a precise and simultaneous recharging of dopant material using additives is to be made possible.

This object is achieved according to the present invention by providing an apparatus for producing a high-purity single-crystal semiconductor ingot from a melt under protective gas, comprising a main crucible with a main heating element for the melt, and a pulling means with a rotating suspension for the ingot; an additional crucible having a heating element for melting recharging materials and an outlet tube for discharging the recharging materials into the main crucible; a first stock container for holding solid recharging material and having a feed mechanism and a feedline to the additional crucible; and a second stock container for holding dopant particles and having a feed mechanism and a feedline to the additional crucible.

The object is furthermore achieved according to the present invention by providing a process for the crucible pulling of high purity single crystal semiconductor material ingots using an apparatus in which a main crucible is connected to an additional crucible which is connected to a stock container and to a feed mechanism, said additional crucible having a capillary, comprising recharging in liquid form the amount of semiconductor material consumed during the pulling process in the main crucible from the additional crucible so that the amount of melt in the main crucible remains approximately constant; and recharging solid semiconductor material from the stock container into the additional crucible, and melting it therein.

The apparatus and the process can, in principle, be used in all crucible pulling processes in which crystal ingots are produced by the Czochralski method, such as being made in particular by the pulling of crystals from oxidic material, for example gallium gadolinium garnet, of compound semiconductors such as gallium arsenide or of semiconductors such as germanium. With particular advantage, they are used for pulling silicon crystal ingots, since these ingots are often produced with large diameter and correspondingly large melt requirement and silicon has, in addition, a considerable volume contraction of about 10% during melting. For reasons of simplicity, the invention will be explained in greater detail below only for silicon: the invention can, however, be analogously applied also to the use of other semiconductor starting materials.

BRIEF DESCRIPTION OF THE DRAWINGS

Other objects and features of the present invention will become apparent from the following detailed description considered in connection with the accompanying drawing which discloses an embodiment of the present invention. It should be understood, however, that the drawing is designed for the purpose of illustration only and not as a definition of the limits of the invention.

In the drawing, the FIGURE shows a partial section view of a preferred embodiment of the apparatus of the present invention.

DETAILED DESCRIPTION OF PREFERRED EMBODIMENTS

Turning now in detail to the drawing, the FIGURE shows the main crucible 1 containing the semiconductor melt 2 from which single crystal 3 is pulled with the aid of a suspension and a pulling apparatus 4 which, as a rule, rotates. Preferably, the crucible can also be rotated about the axis 5. The crucible 1 is heated with the main heating elements 6. The entire pulling apparatus is situated in a vessel housing 7 which has a protective gas stream flowing through it via the gas inlet opening 8 and gas outlet opening 9. The screening housing 10 contains the additional crucible 11 which is heated by the heating elements 12. It has an outlet tube 13 through which the melt 14 can be fed into the main crucible 1, and also the feedlines 15 to a second stock container 16 containing dopant 17, feedline 18 to first stock container 19 containing solid semiconductor material 20 and an exhaust gas line 21. The stock containers for dopant 17 and semiconductor material 20 are provided with feed apparatuses 22 and 23 for metered addition and also a weighing device 24. Dopant container 16 is enclosed by a housing 25, and stock container 19 is enclosed by the housing 26. The housings 25 and 26 are connected in a gas-tight and dust-tight manner to the feedlines 15 and 18, the additional crucible 11 and the exhaust gas line 21, so that the protective gas stream flowing into the system through the inlet opening 27 can leave the feed system comprising these elements mentioned only through the exhaust gas line 21 and the outlet opening 28. The absolute pressure in the pulling system itself, i.e., inside the vessel housing, is 5–50 mbar, in particular 10–30 mbar.

The main crucible is composed, as a rule, of a material which does not have a contaminating action on the semiconductor material, in particular on silicon, that is to say, for example, of quartz, if a silicon single crystal is to be produced. It is preferably constructed as a round shallow crucible having a depth of less than 200 mm. The diameter is preferably 400–1,000 mm. Thus, the diameter is greater than the depth. The crucible expediently contains a ring insert 29 of advantageously the same material, which separates the melt into two regions or chambers. The crystal is pulled from the inner region, while the recharged melt flows into the outer region. Both chambers are connected by cutouts in the lower region of the ring insert for the purpose of mass and heat transfer. The mass of the melt is preferably 15–45 kg, expediently 20–30 kg.

Normally, crystals having a diameter of 100–350 mm are pulled. For this purpose, crucibles having 2–3 times, in particular, however, 2–5 times the diameter are expediently used. The inner crucible will have a 1.4–2.2 times the diameter of the crystal. For example, a crucible having a diameter of about 20" and an insert of about 12" has proved satisfactory for pulling a crystal having a 4" diameter.

Particularly advantageous is the use of shallow crucibles, in particular having a depth of less than 200 mm, for example 140 mm. Such shallow crucibles have the advantage that particularly beneficial resistance and oxygen gradients can be obtained in the crystal as a result of the small amount of melt present in the main crucible.

The crucible is heated with standard heating devices known to the person skilled in the art, for example graphite heaters, having a power requirement, for example of about 40–100 kW, depending on crucible size.

Preferably, the screening housing 10, which is preferably manufactured from a non-contaminating material, for example graphite, is located laterally above the shallow crucible 1. The housing 10 contains the additional crucible 11, which is also preferably composed of materials such as those of the main crucible and contains any desired number of heating elements 12, for example, of graphite, known to the person skilled in the art. In particular, the use of two ring-shaped heating elements surrounding the crucible and arranged one above the other is expedient, the upper element serving to regulate the melting process of the recharged polycrystalline material, while the lower regulates the temperature in the surroundings of the discharge capillary 30.

The additional crucible 11 is fed with dopant via feedline 15 and with polycrystalline silicon via the feedline 18. Furthermore, the exhaust gas line 21 also extends out of the crucible housing 10. Exhaust gas line and feedline are preferably manufactured from materials which are thermally resistant, non-contaminating for the semiconductor material to be crystallized, and also moldable and readily workable. In particular, silicon or quartz is used. The joints between the individual lines, the crucible and the reactor housing are made with seals, preferably of graphite felt or quartz wool. The feedlines expediently have a round cross-section with 20–60 mm diameter so that a blockage due to solid semiconductor material is ruled out. The exhaust gas line has a similar diameter.

The outlet tube 13, through which the melted material is fed into the main crucible, is surrounded with a gas-tight seal from the additional crucible 11 through the screening housing 10. This tube is preferably manufactured from quartz and has a cross-section of 10–50 mm. The junction between the additional crucible and the tube is formed by the capillary 30 through which the metered addition of the added melt takes place. If the viscosity of the melt is high, i.e, the heating power of the lower heating elements 12 surrounding the capillary is low, no melt is forced through the capillary 30. If the heating power is increased, the melt becomes more fluid and can pass through the capillary 30 into the outlet tube 13 and from there into the main crucible 1. The capillary preferably has a diameter of 0.1–4 mm and a length of 2–20 mm, in particular 8–12 mm. The length of the outlet tube depends on the distance of the housing 10 from the crucible 1. In a particular embodiment, 10 may also be arranged outside the actual reactor housing 7. The outlet tube 13 terminates above the melt 2 in the main crucible 1, but in a preferred embodiment it may also be immersed in the melt. In the case of crucibles which are not subdivided into a recharge zone and a crystallization zone, in particular, this avoids turbulence in the melt.

Main crucible 1, main heating elements 6, pulling apparatus 4 and additional crucible 11 are surrounded by a common, in particular water-cooled, housing 7. Expediently, said housing is in two parts, so that the upper parts of the system, which also contain, in particular, the entire recharging apparatus, can be moved aside in order, for example, to replace the main crucible. Flowing through the housing 7 is protective gas, in particular argon, which preferably flows in from above through the inlet 8 and leaves the system again through the outlet 9. According to the invention, the protective gas atmosphere in the interior of the pulling system does not communicate with the protective gas atmosphere in the additional crucible 11 and in the interior of the solid-recharging containers 25 and 26.

Located outside the actual reactor chamber 7 are the stock containers for solid granular material 16 and 19 which are expediently constructed from a non-contaminating material such as quartz. There is no upper limit on their capacity, but the latter is preferably up to 100 kg. They are preferably of funnel-shaped construction and expediently have a feed device 22 or 23, for instance, a spiral conveyor, for discharging a precisely metered amount of material. It is also expedient to provide them with a weighing means 24. In a particular embodiment, they may also be equipped with a slide valve which makes it possible to fill up the stock containers during the operation of the system, evacuate them again and apply them under the desired protective gas pressure and throughput.

Stock container 19, feed mechanism 23 and weighing means 24 for the semiconductor granular material 20 or stock container 16 and feed mechanism 22 for dopant are located in containers 25 or 26, respectively, which have a gas-tight seal and are so constructed that a free gas exchange with the feed tubes 15 and 18 is possible. At least one of the containers 25 or 26 has a gas inlet opening 27 which makes it possible to introduce protective gas into the container. The stock containers 25 and 26, the feedlines 15 and 18, and also the housing for the additional crucible 10 together form a unit which is sealed in a gas-tight and dust-tight manner with respect to the surroundings and the actual reactor housing. This part of the apparatus is fed via the gas inlet opening 27 with a protective gas stream which is discharged via the exhaust gas tube 21 and the gas outlet opening 28. The argon flow is about 25-150 standard l/h, in particular 50-100 standard l/h. In this system with a gas-tight seal, a pressure is preferably maintained which is a few millibar below the pressure of the reactor interior, in order to facilitate the extraction of impurities. This not only keeps away dust particles present in the solid silicon and automatically produced during feeding as a result of friction from the interior of the pulling system, but it also removes $SiO_x$ particles and impurities which are produced in the melting of the fine-grained silicon in the additional crucible.

The low pressure in the system also makes it possible, in combination with the protective gas stream, to flush the system with protective gas after loading the stock container with fresh material and, consequently, to remove oxygen and atmospheric moisture from the system, so that it is possible to work with the greatest cleanliness even while loading the system.

As in the reactor interior, the protective gas used is preferably argon.

In the actual pulling process, an initial weighed amount of about 15-35 kg of silicon is introduced into the main crucible 1, which is kept as shallow as possible in order to obtain beneficial thermal conditions in the melt. When crystals having large diameters (up to 30 cm) or large length (about 2 m) are being pulled, the material withdrawn from the amount of melt in the main crucible as a result of the crystallization is therefore continuously recharged from the additional crucible. For this purpose, the additional crucible contains 1 to 2 kg of melt, which is, in turn, melted and replenished from solid material fed from the stock containers 19 and 16.

The mass balance of the process is controlled in such a way that the mass of the main melt remains constant. Additional melt from the additional crucible is recharged into the main crucible in accordance with the amount of melt which is withdrawn by the crystallization process. This can be done, for example, by varying the temperature of the heating, which results in a change in the viscosity of the melt and, consequently, in a change in the rate of feed from the additional crucible into the main crucible through the capillary 30. Furthermore, the metered addition of the recharging material can also be carried out directly by controlling the topped-up amount of solid material from the stock container 19.

A constant dopant content and, consequently, resistance along the axis of the crystal produced is achieved by suitable addition of dopant 17 from the dopant container 16.

The amount of polycrystalline material and dopant which has to be recharged is advantageously continuously determined from the measurement of the mass already crystallized, using the length and thickness of the crystal and from weighing the recharged silicon. Depending on the pulling rate, the amount of recharged material in the case of a 4" diameter crystal is 20–40 g/min.

The length of the crystal so grown is only limited by the length of the furnace when complete and is, as a rule, not more than 3 m, in particular 2.50 m. In the case of a 4" diameter crystal, 5 cm of crystal ingot weigh about 1 kg, so that, in total, about 50 kg of melt have to be introduced for a crystal having a length of 250 cm and 4" diameter.

Polycrystalline finely crushed, or granular material, is provided in stock container 19 as polycrystalline raw material. In this connection, the chosen grain size has to be sufficiently small for the material to be able to pass without difficulties through the feed mechanism 23 into the feedline 18 and, consequently, into the additional crucible, preferably as a result of freefall. The amount of material reaching the additional crucible can be precisely weighed by a weighing means known to the person skilled in the art, and dopant can be added accordingly. The metered addition of dopant is adjusted by means of a balance, or preferably, by the addition of a counted number of dopant particles, that is to say, silicon particles which contain an adjusted amount of dopant.

The invention has the advantage that the length of the crystals is no longer limited by the initial weighed amount of material, even in the case of large crystal diameters, even if the shallow crucibles needed for the optimum single-crystal growth are used. The crystal quality remains intact without limitation even with a very large proportion of recharged melt compared with that originally present in the main crucible. As a result of the complete separation of the recharging unit, dust particles and the impurities are completely kept away from the melt contained in the main crucible and therefore no longer disturb the single-crystal growth. Impurities such as $SiO_x$, which is normally produced when the recharging material is melted and is recharged with the melt formed, are extracted by the exhaust gas stream via the exhaust gas line and, consequently, removed from the system. In the pulling systems which were hitherto standard, the atmosphere in the vessel was, as a rule, in communication with the atmosphere of the feed mechanism during recharging and, consequently, a separation of such impurities was rendered impossible. It was only possible to purify the recharging material before the actual melting, i.e., by evacuation and protective gas flushing.

The occurrence of thermal disturbances is reduced by the recharging of already melted material. Since no thermal disturbances occur, production rejects as a result of dislocations in the growth are reduced and, at the same time, the volume of the melt is reduced. The melt is relatively small compared with batch-operated Czochralski systems at present in operation, so that good radial gradients are obtained for resistance and oxygen. As a result of the volume of the melt being kept constant, the oxygen content of the single crystal remains axially constant, and constant growth conditions prevail in the system.

Furthermore, the simplicity and the small size of the additional crucible makes it possible to incorporate a complete recharging facility in every pulling vessel. Recharging material can be topped up and seed crystals can be inserted without the actual pulling region having to be opened and the system disturbed, so that several crystals can be pulled one after another.

The apparatus consequently furthermore has the advantage that the expensive quartz crucibles have a substantially longer service life since they do not have to be cooled between two pulling processes, which results, as a rule, in shattering of the crucible as a result of the volumetric expansion when the silicon solidifies. Instead, a new pulling process can be started immediately by applying a new seed crystal to the still full crucible.

Furthermore, the process has the advantage that a precisely metered addition of dopant is also possible, and this enables a constant dopant level to be adjusted in the crystal in an axially continuous manner. In contrast to the processes in the prior art, impurities and dust particles which are produced by the addition of dopant to the melt can also be removed during melting. The precise adjustment of a known dopant concentration is particularly important in the case of phosphorus-doped crystals in which, because of the low segregation coefficient of phosphorus ($k_{eff}=0.35$), only a small proportion of the crystal falls within standard resistance specifications. Crystals which have been pulled by the apparatus and according to the invention, on the other hand, fall within very narrow resistance specifications along the entire axis.

The apparatus and the process are explained below with reference to an illustrative example which is not to be deemed limitative of the present invention in any manner thereof.

EXAMPLE

A commercial conventional crucible pulling system having a vessel diameter of 800 mm is equipped inside the pulling vessel with an additional heater for melting the recharged polycrystalline silicon/dopant mixture, comprising two graphite heating elements which can be regulated independently of one another, and which are arranged around an additional quartz crucible (capacity 1 kg) having an outlet capillary. By means of two quartz feedlines, the additional crucible is equipped with two stock containers for dopant and polycrystalline granular silicon material (capacity 25 kg), the latter also being equipped with vibrator, special conveyor and weighing means. All the surfaces in the recharging apparatus are coated with non-contaminating material, namely quartz or silicon.

The furnace equipment is designed for flat quartz crucibles having a diameter of 20" and a depth of 140 mm. The crucible contains a ring insert having a diameter of 12" and a height of 120 mm, which separates the melt into two separate chambers or regions. A crystal having a diameter of 4" is pulled from the inner region from the melt heated by a graphite heater having a power requirement of 60 kW, while the recharged melt flows into the outer region. The initial mass of the melt of 25 kg is kept constant by continuously recharging with melt material from the additional crucible.

The additional quartz crucible is arranged with the additional heating elements in the pulling vessel in such a manner that the capillary provided under the crucible out of which the liquified silicon flows is placed approximately in the center of the outer region of the main crucible in the radial direction. The liquified silicon drops by freefall from the end of the capillary into the main melt.

By means of a weighing system, the amount of solid silicon is determined, which is brought out of the stock container via the feed system, into the additional crucible. At the same time, the thickness and length of the pulled crystals are continuously measured. The amount of silicon which is withdrawn with the doped single crystal is resupplied by the recharging apparatus, melted in the additional crucible after adding the calculated amount of phosphorous as dopant, and supplied to the main crucible.

During the pulling process an argon pressure of 15 mbar is maintained in the vessel, and of 1 mbar less in the recharging apparatus.

After reaching the desired length, the pulling process is terminated by pulling the terminal cone. In this manner, a dislocation-free crystal having a length of 150 cm with a cylindrical shape and a weight of about 32 kg was pulled. The dopant content of $1 \times 10^{15}$ atoms/cm$^3$ measured on the basis of resistance values of 5 $\Omega$.cm remained constant in the range of $+/-10\%$ along the entire length.

While only a single embodiment of the present invention has been shown and described, it is to be understood that many changes and modifications may be made thereunto without departing from the spirit and scope of the invention as defined in the appended claims.

What is claimed is:

1. A process for the crucible pulling of high purity single crystal semiconductor material ingots using an apparatus with a main crucible and an additional crucible having a heatable outlet tube for feeding said main crucible with molten material, said additional crucible sealed in a gas-tight and dust-tight manner with respect to said main crucible, comprising:

feeding said additional crucible with solid semiconductor material from a first stock container and with dopant from a second stock container via feed lines, and melting it therein;

continuously flushing a protective gas stream through said stock containers, feed lines and said additional crucible having a pressure which is less than the pressure of the atmosphere in the main crucible;

recharging the amount of semiconductor material consumed during the crystal pulling by feeding molten material through said outlet tube of said additional crucible into the main crucible so that the amount of melt in the main crucible remains approximately constant;

controlling the amount of recharged material by increasing or lowering the heating power applied to said outlet tube to control the viscosity of the molten material passing through; and controlling the dopant concentration in the main crucible by the amount of dopant feed into said additional crucible.

2. The process according to claim 1, wherein the high purity single crystal semiconductor ingot is of silicon.

3. A process for the crucible pulling of high purity single crystal semiconductor material ingots using an apparatus with a main crucible and an additional crucible having a heatable outlet tube for feeding said main crucible with molten material, said additional crucible sealed in a gas-tight and dust-tight manner with respect to said main crucible, comprising:

feeding said additional crucible with solid semiconductor material from a first stock container and with dopant from a second stock container via feed lines, and melting it therein;

continuously flushing a protective gas stream through said stock containers, feed lines and said additional crucible, said protective gas stream providing an atmosphere in said additional crucible having a pressure which is less than the pressure of the atmosphere in the main crucible;

recharging the amount of semiconductor material consumed during the crystal pulling by feeding molten material through said outlet tube of said additional crucible into the main crucible so that the amount of melt in the main crucible remains approximately constant;

controlling the amount of recharged material by increasing or lowering the heating power applied to the amount of solid semiconductor material fed and which is melted in said additional crucible; and controlling the dopant concentration in the main crucible by the amount of dopant fed into said additional crucible.

4. The process according to claim 3, wherein the high purity single crystal semiconductor ingot is of silicon.

* * * * *